(12) United States Patent
Seow et al.

(10) Patent No.: US 11,283,429 B1
(45) Date of Patent: Mar. 22, 2022

(54) XOR BASED NON-OVERLAPPING CLOCK GENERATOR

(71) Applicant: PixArt Imaging Incorporation, Hsinchu (TW)

(72) Inventors: Boon-Eu Seow, Penang (MY); Ping-Seng Lee, Penang (MY)

(73) Assignee: PIXART IMAGING INCORPORATION, Hsinchu (TW)

( * ) Notice: Subject to any disclaimer, the term of this patent is extended or adjusted under 35 U.S.C. 154(b) by 0 days.

(21) Appl. No.: 17/223,925

(22) Filed: Apr. 6, 2021

(51) Int. Cl.
*H03K 3/012* (2006.01)
*G06F 1/08* (2006.01)
*G06F 1/06* (2006.01)
*H03K 19/21* (2006.01)

(52) U.S. Cl.
CPC .............. *H03K 3/012* (2013.01); *G06F 1/06* (2013.01); *G06F 1/08* (2013.01); *H03K 19/21* (2013.01)

(58) Field of Classification Search
CPC .......... H03K 3/012; H03K 19/21; G06F 1/06; G06F 1/08
USPC ........................................................ 327/295
See application file for complete search history.

(56) References Cited

U.S. PATENT DOCUMENTS

| | | | | |
|---|---|---|---|---|
| 6,806,761 B1 * | 10/2004 | Aude | .................... | H02M 3/073 |
| | | | | 327/536 |
| 9,755,872 B1 * | 9/2017 | Tertinek | ................. | H03K 5/131 |
| 2020/0007113 A1 * | 1/2020 | Murphy | ................. | H03K 3/013 |

* cited by examiner

*Primary Examiner* — Tomi Skibinski
(74) *Attorney, Agent, or Firm* — Tung & Associates (57) ABSTRACT

A non-overlapping clock generator generating an in-phase output clock signal and a reversed-phase output clock signal which are non-overlapped with each other, includes: a first and a second XOR gates, a first and a second load transistors, which are cross coupled, and includes: a first and a second delay circuits. The first delay circuit is coupled between the in-phase output clock signal and a control terminal of the first load transistor. The second delay circuit is coupled between the reversed-phase output clock signal and a control terminal of the second load transistor. Each of the XOR gates includes at least one pass transistor logic circuit configured to execute XOR logic operation and coupled to a first control voltage. A non-overlapping period is determined according to the first control voltage and/or a first delay period of the first delay circuit and a second delay period of the second delay circuit.

9 Claims, 8 Drawing Sheets

XOR BASED NON-OVERLAPPING CLOCK GENERATOR

BACKGROUND OF THE INVENTION

Field of Invention

The present invention relates to a non-overlapping clock generator; particularly, it relates to an XOR (Exclusive-OR) based non-overlapping clock generator.

Description of Related Art

Figure 1A:
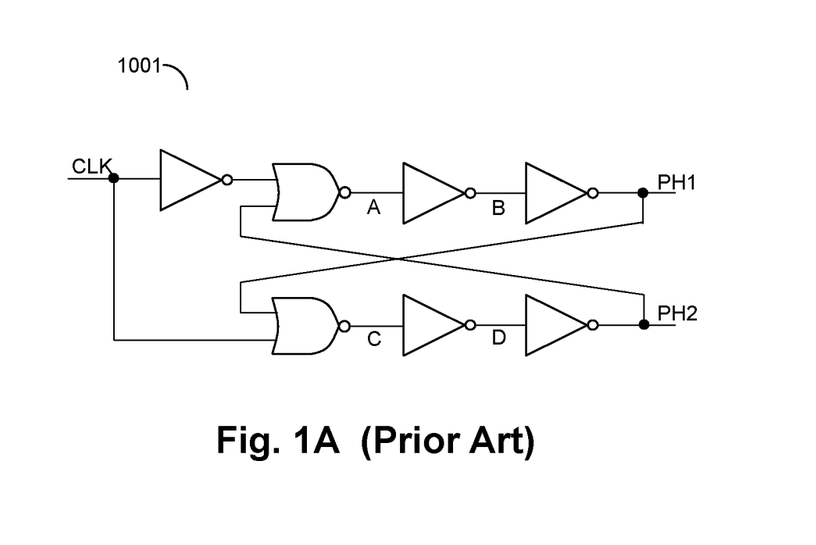
FIG. 1A shows a schematic diagram of a conventional non-overlapping clock generator.
Figure 1B:
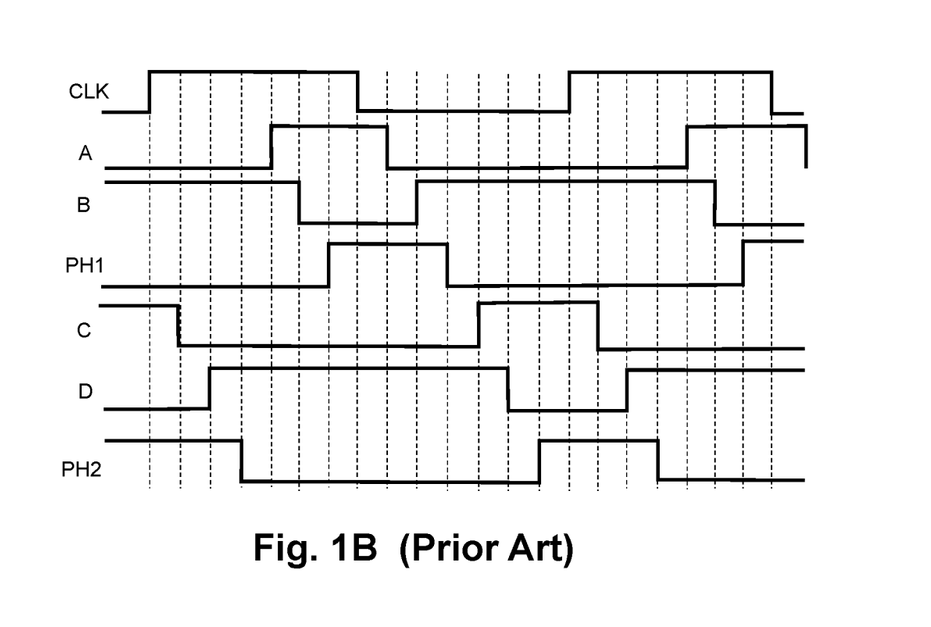
FIG. 1B shows a signal waveform diagram depicting the operation of a conventional non-overlapping clock generator of FIG. 1A.

Please refer to FIG. 1A and FIG. 1B. FIG. 1A shows a schematic diagram of a conventional non-overlapping clock generator. FIG. 1B shows a signal waveform diagram depicting the operation of a conventional non-overlapping clock generator of FIG. 1A. The conventional non-overlapping clock generator 1001 includes: two branches of a NAND gate and plural cascaded NOT gates, which are cross coupled to each other. The conventional non-overlapping clock generator 1001 is configured to operably generate an in-phase output clock signal PH1 and a reversed-phase output clock signal PH2 according to an input clock signal CLK. The in-phase output clock signal PH1 and the reversed-phase output clock signal PH2 are non-overlapped with each other.

The prior art non-overlapping clock generator 1001 shown in FIG. 1A and FIG. 1B has following drawbacks that: when the input clock frequency is lower or when a non-overlapping period which lies between the in-phase output clock signal PH1 and the reversed-phase output clock signal PH2 is required to be relatively longer, the prior art needs excessively large amount of circuit area and consumes larger current.

Compared to the prior art non-overlapping clock generator 1001 shown in FIG. 1A and FIG. 1B, the non-overlapping clock generator of the present invention is advantageous in that: the present invention can effectively reduce the circuit area and current consumption, especially for application requiring lower frequency or longer non-overlapping period.

SUMMARY OF THE INVENTION

From one perspective, the present invention provides a non-overlapping clock generator, which is configured to operably generate an in-phase output clock signal and a reversed-phase output clock signal, non-overlapped with each other, according to an input clock signal; the non-overlapping clock generator comprising: a first XOR gate and a second XOR gate, which are cross coupled to each other, wherein a first input terminal of the first XOR gate is configured to operably receive an in-phase sub-signal of the input clock signal, and a second input terminal of the first XOR gate is configured to operably receive a first control voltage, wherein a first input terminal of the second XOR gate is configured to operably receive a reversed-phase sub-signal of the input clock signal, and a second input terminal of the second XOR gate is configured to operably receive the first control voltage, wherein the first XOR gate is configured to operably generate the reversed-phase output clock signal at a reversed-phase output terminal of the non-overlapping clock generator, and the second XOR gate is configured to operably generate the in-phase output clock signal at an in-phase output terminal of the non-overlapping clock generator; a first load transistor having a first terminal coupled to the in-phase output terminal of the non-overlapping clock generator, wherein a control terminal of the first load transistor is controlled by the reversed-phase output clock signal; and a second load transistor having a first terminal coupled to the reversed-phase output terminal of the non-overlapping clock generator, wherein a control terminal of the second load transistor is controlled by the in-phase output clock signal; wherein each one of the first XOR gate and the second XOR gate includes: at least one pass transistor logic circuit, which is configured to operably execute XOR logic operation according to corresponding input signals on the first input terminal and the second input terminal, wherein the at least one pass transistor logic circuit is coupled to the first control voltage; wherein a non-overlapping period which lies between the in-phase output clock signal and the reversed-phase output clock signal is determined according to the first control voltage.

In one embodiment, each XOR gate of the first XOR gate and the second XOR gate includes: a first transistor having a control terminal coupled to the first input terminal, wherein a first terminal of the first transistor is coupled to an output terminal of the XOR gate; a second transistor having a control terminal coupled to the first input terminal, wherein a first terminal of the second transistor is coupled to the output terminal, and a second terminal of the second transistor is coupled to the second input terminal; and a third transistor having a control terminal coupled to the second input terminal, wherein a first terminal of the third transistor is coupled to the output terminal, and a second terminal of the third transistor is coupled to the first input terminal.

In one embodiment, the first control voltage is greater than a first preset value, so as to prevent the first transistor and the second transistor of the each XOR gate of the first XOR gate and the second XOR gate from being nonconductive simultaneously, wherein the first preset value is correlated with a conduction threshold voltage of at least one of the transistors in the XOR gate.

In one embodiment, the first control voltage is smaller than a difference between a power supply voltage of the non-overlapping clock generator and a conduction threshold voltage of the at least one of the transistors in the each one of the first XOR gate and the second XOR gate.

In one embodiment, the first control voltage is configured as a power supply voltage of the non-overlapping clock generator.

In one embodiment, the each XOR gate of the first XOR gate and the second XOR gate further includes: a fourth transistor, which is connected in series to the first transistor, wherein the fourth transistor has a control terminal coupled to a third input terminal of the XOR gate; wherein the third input terminal of the first XOR gate and the third input terminal of the second XOR gate are coupled to a second control voltage; wherein the non-overlapping period is determined further according to the second control voltage.

In one embodiment, the second control voltage is greater than a conduction threshold voltage of at least one of the transistors in the XOR gate, and wherein the second control voltage is smaller than or equal to a power supply voltage of the non-overlapping clock generator.

In one embodiment, the non-overlapping clock generator of further comprises: a first delay circuit, which is coupled between the reversed-phase output terminal of the non-overlapping clock generator and the control terminal of the first load transistor, wherein the first delay circuit is configured to operably delay the reversed-phase output clock signal for a first delay period, so as to generate a reversed-phase delay signal for controlling the first load transistor;

and a second delay circuit, which is coupled between the in-phase output terminal of the non-overlapping clock generator and the control terminal of the second load transistor, wherein the second delay circuit is configured to operably delay the in-phase output clock signal for a second delay period, so as to generate an in-phase delay signal for controlling the second load transistor; wherein the non-overlapping period is determined further according to the first delay period and the second delay period.

In one embodiment, each one of the first delay circuit and the second delay circuit includes: plural delay units, which are connected in series, wherein the plural delay units are configured to operably generate a corresponding delay period; and a selection circuit, which is configured to operably select a quantity of the plural delay units connected in serial, so as to adjust the corresponding delay period.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 2:
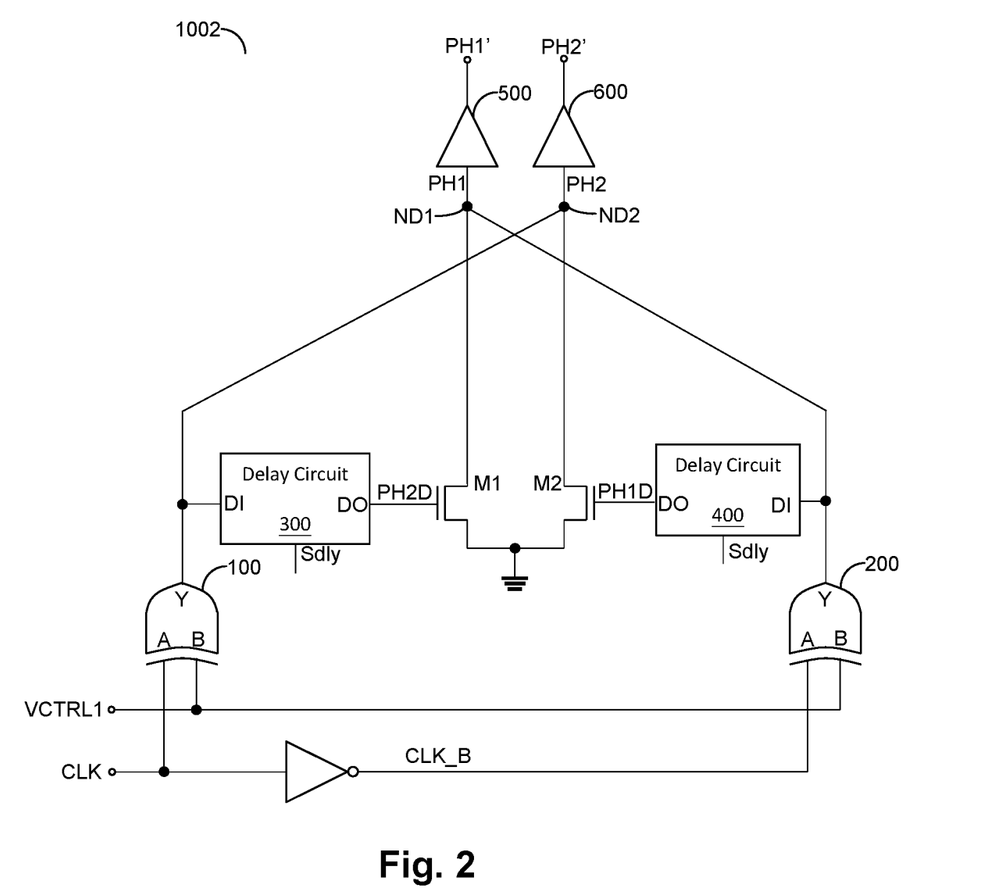
FIG. 2 shows a schematic circuit diagram of a non-overlapping clock generator according to the present invention.
Figure 7:
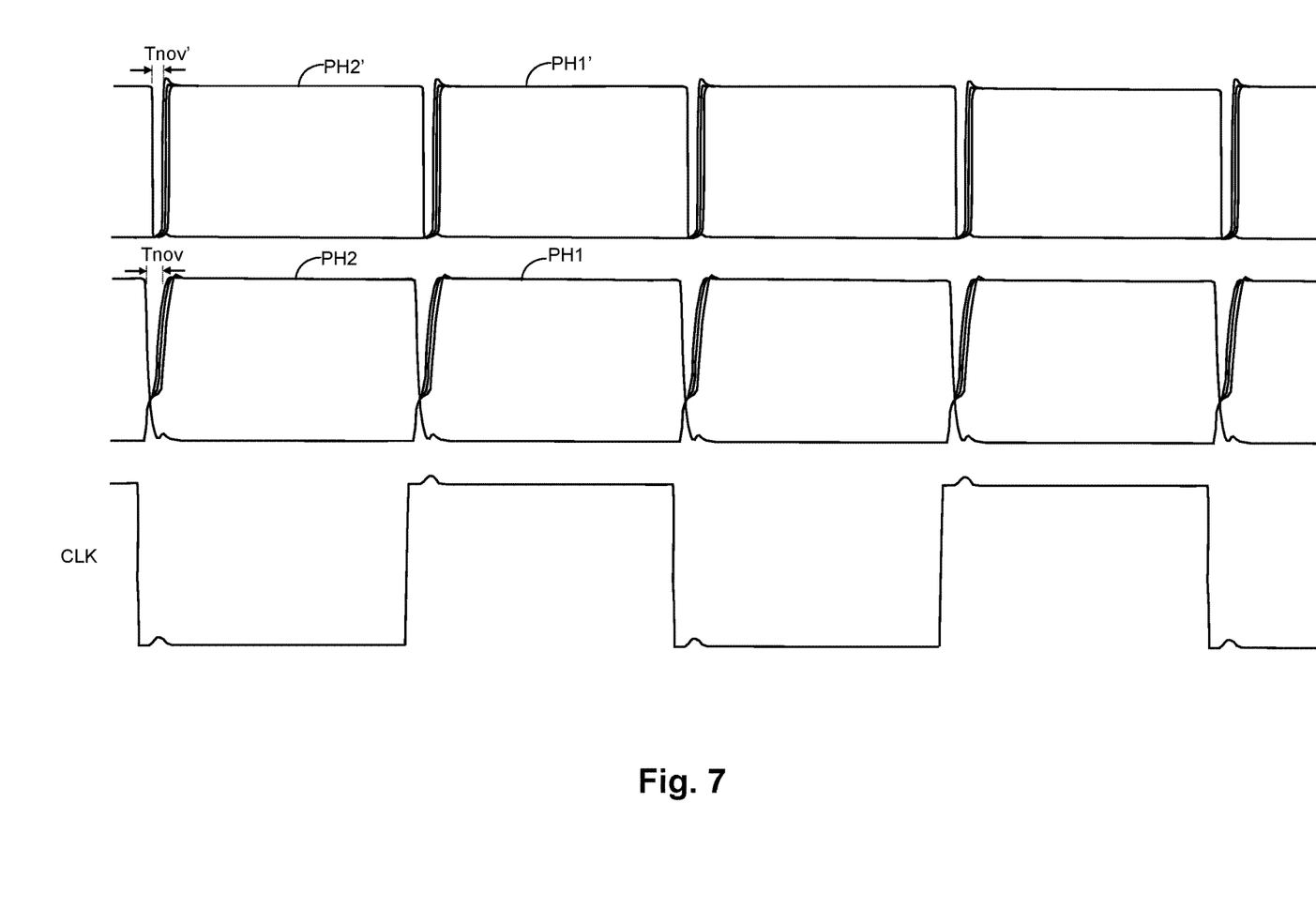
FIG. 7 shows a signal waveform diagram depicting the operation of a non-overlapping clock generator of the present invention.

Please refer to FIG. 2, which shows a schematic circuit diagram of a non-overlapping clock generator (i.e., non-overlapping clock generator 1002) according to an embodiment of the present invention. As shown in FIG. 2, the non-overlapping clock generator 1002 of the present invention is configured to operably generate an in-phase output clock signal PH1 and a reversed-phase output clock signal PH2 according to an input clock signal, wherein the in-phase output clock signal PH1 and the reversed-phase output clock signal PH2 are non-overlapped with each other. Please refer to FIG. 2 along with FIG. 7. FIG. 7 shows a signal waveform diagram depicting the operation of a non-overlapping clock generator of the present invention. In other words, as shown in FIG. 7, a non-overlapping period Tnov lies between the in-phase output clock signal PH1 and the reversed-phase output clock signal PH2. In one embodiment, during the non-overlapping period Tnov, the in-phase output clock signal PH1 and the reversed-phase output clock signal PH2 are both at a disabled state (e.g., at a low level). The aforementioned input clock signal includes: an in-phase sub-signal CLK and a reversed-phase sub-signal CLK_B. The reversed-phase sub-signal CLK_B can be generated according to the in-phase sub-signal CLK via for example an inverter. The in-phase sub-signal CLK and the reversed-phase sub-signal CLK_B may be can be overlapped with each other at rising edges or falling edges.

As shown in FIG. 2, the non-overlapping clock generator 1002 includes: a first XOR gate 100, a second XOR gate 200, a first load transistor M1 and a second load transistor M2.

The first XOR gate 100 and the second XOR gate 200 are cross coupled to each other. To elaborate in more detail, in one embodiment, a first input terminal (A) of the first XOR gate 100 is configured to operably receive the in-phase sub-signal CLK of the input clock signal, and a second input terminal (B) of the first XOR gate 100 is configured to operably receive a first control voltage VCTRL1. On the other hand, a first input terminal (A) of the second XOR gate 200 is configured to operably receive a reversed-phase sub-signal CLK_B of the input clock signal, and a second input terminal (B) of the second XOR gate 200 is configured to operably receive the first control voltage VCTRL1. Through the coupling configuration described above, the first XOR gate 100 is configured to operably generate the reversed-phase output clock signal PH2 (via output terminal Y of the first XOR gate 100) at a reversed-phase output terminal ND2 of the non-overlapping clock generator 1002, and the second XOR gate 200 is configured to operably generate the in-phase output clock signal PH1 (via output terminal Y of the second XOR gate 200) at an in-phase output terminal ND1 of the non-overlapping clock generator 1002.

The first load transistor M1 includes a first terminal (e.g., corresponding to a drain) coupled to the in-phase output terminal ND1 (e.g., corresponding to the output terminal Y of the first XOR gate 100) of the non-overlapping clock generator 1002. A control terminal (e.g., corresponding to a gate) of the first load transistor M1 is controlled by the reversed-phase output clock signal PH2. On the other hand, the second load transistor M2 includes a first terminal coupled to the reversed-phase output terminal ND2 (e.g., corresponding to the output terminal Y of the second XOR gate 200) of the non-overlapping clock generator 1002. A control terminal of the second load transistor M2 is controlled by the in-phase output clock signal PH1.

In one embodiment, each one of the first XOR gate 100 and the second XOR gate 200 includes: at least one pass transistor logic circuit which is configured to operably execute XOR logic operation according to signals received through the corresponding input terminals A and B to generate a corresponding output signal at the corresponding output terminal Y. The at least one pass transistor logic circuit is coupled to the first control voltage VCTRL1. The configuration and operation of the pass transistor logic circuit will be explained in detail later.

In one embodiment, a non-overlapping period Tnov (referring to FIG. 7) which lies between the in-phase output clock signal PH1 and the reversed-phase output clock signal PH2 is determined according to the first control voltage VCTRL1.

In one embodiment, as shown in FIG. 2, the non-overlapping clock generator 1002 further includes: a buffer circuit 500 and a buffer circuit 600. The buffer circuit 500 is configured to operably buffer and shape the in-phase output clock signal PH1, so as to generate an in-phase output clock signal PH1'. The buffer circuit 600 is configured to operably buffer and shape the reversed-phase output clock signal PH2, so as to generate a reversed-phase output clock signal PH2'. Likewise, a non-overlapping period Tnov' lies between the in-phase output clock signal PH1' and the reversed-phase output clock signal PH2'.

Figure 3:
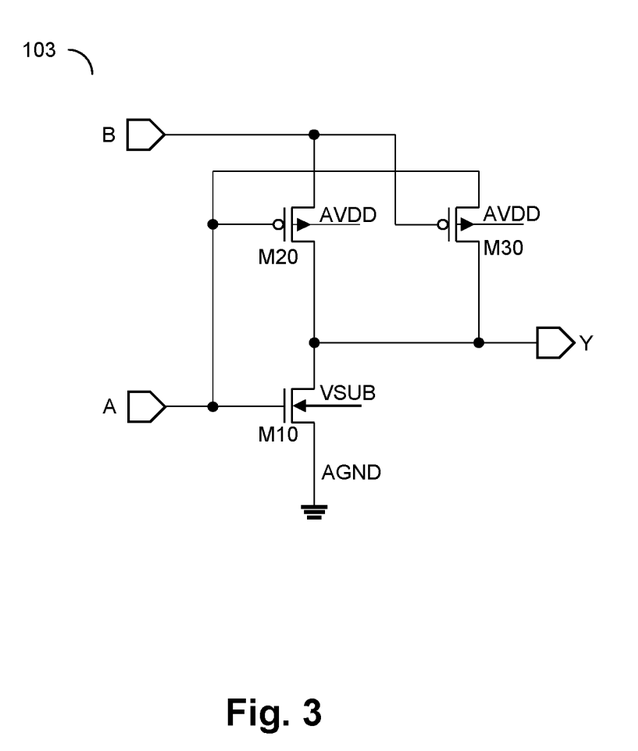
FIG. 3 shows a specific embodiment of an XOR gate in the non-overlapping clock generator according to the present invention.

FIG. 3 shows a specific embodiment of an XOR gate (i.e., XOR gate 103 of FIG. 3, corresponding to a first XOR gate 100 or a second XOR gate 200 shown in FIG. 2) of the non-overlapping clock generator according to the present invention. The XOR gate 103 includes: a first transistor M10, a second transistor M20 and a third transistor M30.

The first transistor M10 includes a control terminal coupled to the first input terminal (A) of the XOR gate 103. A first terminal of the first transistor M10 is coupled to an output terminal (Y) of the XOR gate 103, and a second terminal of the first transistor M10 is coupled to a reference voltage level (e.g., ground voltage level). More specifically, in this embodiment, the first transistor M10 is configured to operably pull-down the level of the output terminal of the XOR gate 103.

The second transistor M20 includes a control terminal coupled to the first input terminal (A). A first terminal of the second transistor M20 is coupled to the output terminal (Y) of the XOR gate 103, and a second terminal of the second transistor M20 is coupled to the second input terminal (B) of the XOR gate 103. The third transistor M30 includes a control terminal coupled to the second input terminal (B) of the XOR gate 103. A first terminal of the third transistor M30 is coupled to the output terminal (Y) of the XOR gate 103, and a second terminal of the third transistor M30 is coupled to the first input terminal (A) of the XOR gate 103. To elaborate in more detail, in this embodiment, a source of the second transistor M20 and a source of the third transistor M30 are both configured as input terminals. In other words, the XOR gate 103 includes at least: a pass transistor logic circuit, which employs a combination of the second transistor M20 and the third transistor M30. It is noteworthy that, in one embodiment, the aforementioned pass transistor logic simply requires three transistors (i.e., M10, M20 and M30) for the exclusive-OR function of the XOR gate 103. Based on the aforementioned XOR gates, the non-overlapping clock generator 1002 can be formed. Besides, because the aforementioned XOR gate 103 employs a pass transistor logic circuit, an XOR based non-overlapping clock generator 1002 can adjust the non-overlapping period Tnov through adjusting a voltage (e.g., the first control voltage VCTRL1) of at least one input terminal of the XOR gate 103.

In one embodiment, the aforementioned first control voltage VCTRL1 is greater than a first preset value, so as to prevent the first transistor M10 and the second transistor M20 of the XOR gate (e.g., the first XOR gate 100 or the second XOR gate 200) from being nonconductive simultaneously. In one embodiment, the first preset value is correlated with a conduction threshold voltage of the first transistor M10 and the second transistor M20.

Figure 4A:
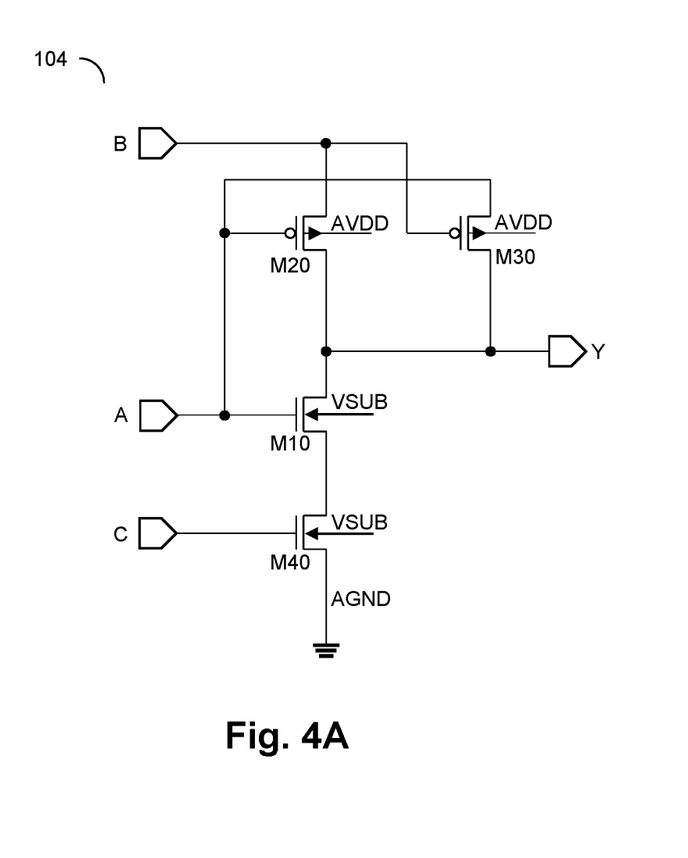
FIG. 4A shows another specific embodiment of an XOR gate of the non-overlapping clock generator according to the present invention.

4A shows another specific embodiment of an XOR gate (i.e., XOR gate 104 in FIG. 4A, corresponding to a first XOR gate 100 or a second XOR gate 200 shown in FIG. 2) of the non-overlapping clock generator according to the present invention. The XOR gate 104 in this embodiment shown in FIG. 4A is similar to the XOR gate 103 in previous embodiment shown in FIG. 3, but is different in that: the XOR gate 104 in this embodiment further includes: a fourth transistor M40, which is connected in series to a first transistor M10. In this embodiment, the fourth transistor M40 is coupled between the first transistor M10 and a ground voltage level. Besides, in this embodiment, the fourth transistor M40 has a control terminal coupled to a third input terminal C of the XOR gate 104.

In one embodiment, as shown in FIG. 4A, on one hand, the first transistor M10 and the fourth transistor M40 can be configured as, for example but not limited to, an NMOS transistor. The body contacts of the first transistor M10 and the fourth transistor M40 can be coupled to a substrate bias voltage VSUB. On the other hand, the second transistor M20 and the third transistor M30 can be configured as, for example but not limited to, a PMOS transistor. Under such situation, body contacts of the second transistor M20 and the third transistor M30 can be coupled to a power supply voltage AVDD.

Figure 4B:
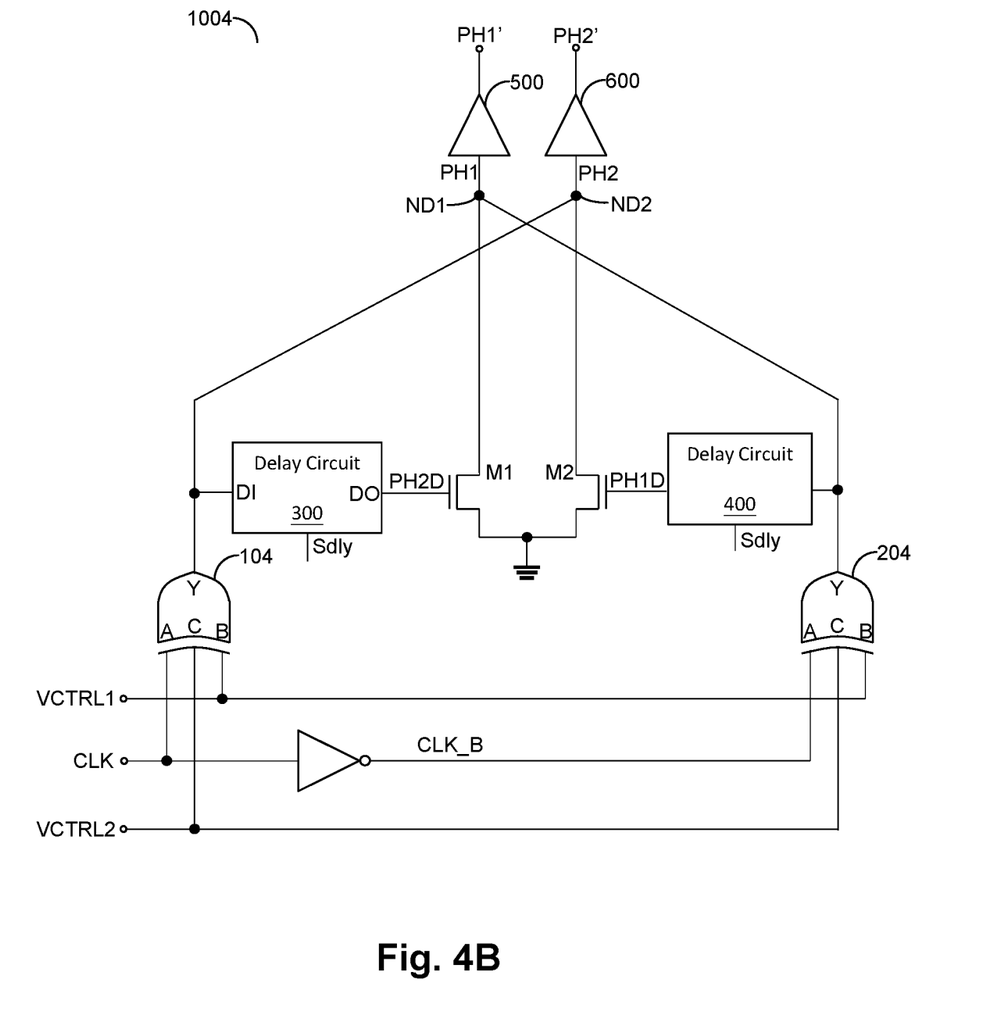
FIG. 4B shows a schematic circuit diagram of a non-overlapping clock generator according to an embodiment of the present invention.

FIG. 4B shows a schematic circuit diagram of a non-overlapping clock generator (i.e., non-overlapping clock generator 1004) according to an embodiment of the present invention. The non-overlapping clock generator 1004 in this embodiment shown in FIG. 4A is similar to the non-overlapping clock generator 1002 in previous embodiment shown in FIG. 2, but is different in that: the non-overlapping clock generator 1004 includes: a first XOR gate 104 and a second XOR gate 204 (both of which correspond to the aforementioned XOR gate 104 shown in FIG. 4A). The third input terminal C of the first XOR gate 104 and the third input terminal C of the second XOR gate 204 are coupled to a second control voltage VCTRL2. In one embodiment, as shown in FIG. 4B, the non-overlapping period Tnov (referring to FIG. 7) is determined further according to the second control voltage VCTRL2. In one embodiment, the second control voltage VCTRL2 is greater than a conduction threshold voltage of the fourth transistor M40.

Please still refer to FIG. 2 in conjugation with FIG. 4B. In one embodiment, the non-overlapping clock generator (i.e., non-overlapping clock generator 1002 and non-overlapping clock generator 1004) further includes a delay circuit 300 and a delay circuit 400. As shown in FIG. 2, the delay circuit 300 is coupled between the reversed-phase output terminal ND2 of the non-overlapping clock generator 1002 and the control terminal of the first load transistor M1. As shown in FIG. 2, the delay circuit 300 is configured to operably delay the reversed-phase output clock signal PH2 for a first delay period, so as to generate a reversed-phase delay signal PH2D for controlling the first load transistor M1. On the other hand, the delay circuit 400 is coupled between the in-phase output terminal ND1 of the non-overlapping clock generator 1002 and the control terminal of the second load transistor M2. The delay circuit 400 is configured to operably delay the in-phase output clock signal PH1 for a second delay period, so as to generate an in-phase delay signal PH1D for controlling the second load transistor M2. In this embodiment, the non-overlapping period Tnov and the non-overlapping period Tnov' is determined further according to the first delay period and the second delay period.

Figure 5:
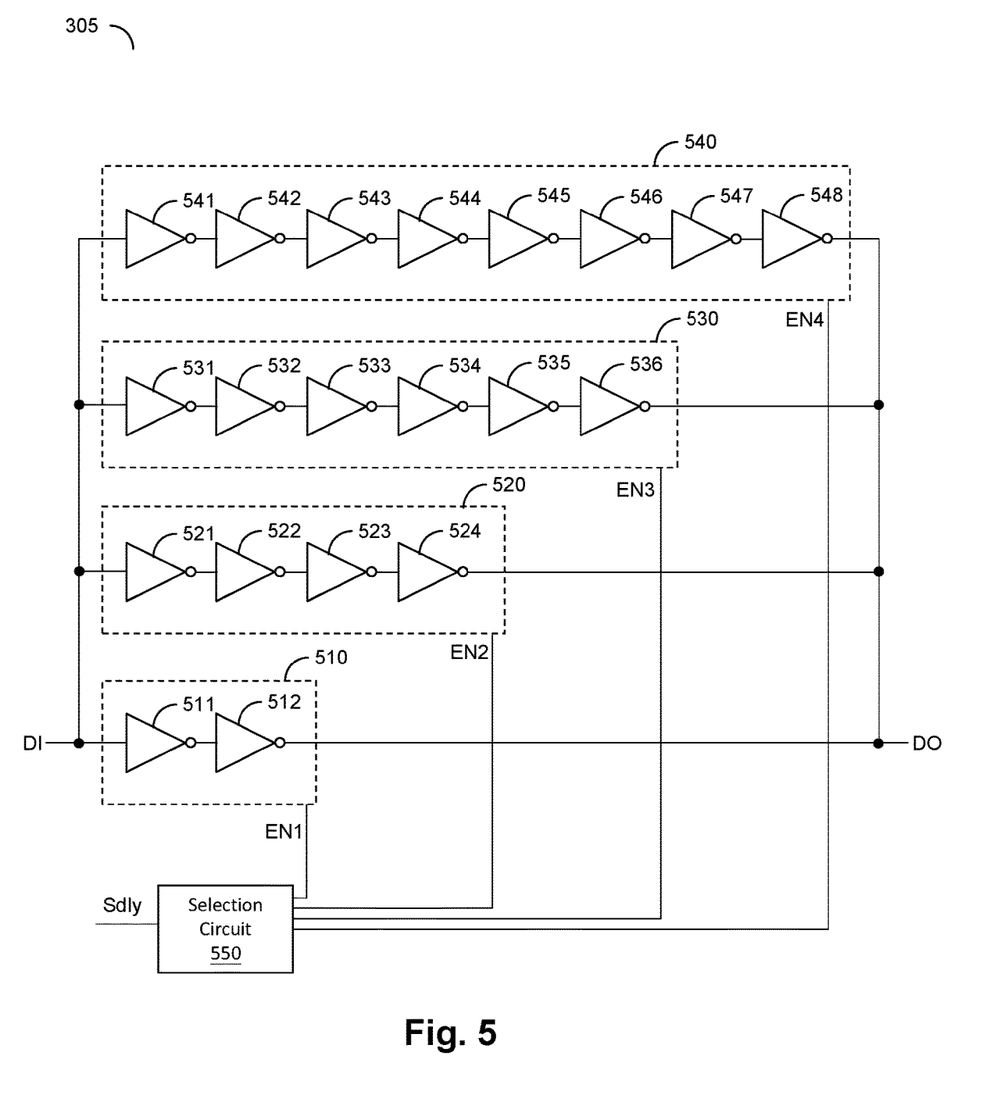
FIG. 5 shows a specific embodiment of a delay circuit of the non-overlapping clock generator according to the present invention.

Please refer to FIG. 5 showing a specific embodiment of a delay circuit (i.e., delay circuit 305 in FIG. 5, corresponding to the delay circuit 300 or the delay circuit 400 shown in FIG. 2 and FIG. 4B) of the non-overlapping clock generator according to the present invention. In one embodiment, as shown in FIG. 5, the delay circuit 305 includes one or plural delay units and a selection circuit 550. In one embodiment, as shown in FIG. 5, the delay units include, for example but not limited to, delay units 511~512, delay units 521~524, delay units 531~536 and delay units 541~548. The delay units 511~512 are connected in series, to form a delay branch 510, which is configured to operably generate a corresponding delay period. Besides, the delay units 521~524 are connected in series, to form a delay branch 520, which is configured to operably generate a corresponding delay period. The delay units 531~536 are connected in series, to form a delay branch 530, which is configured to operably generate a corresponding delay period. Likewise, the delay units 541~548 are connected in series, to form a delay branch 540, which is configured to operably generate a corresponding delay period. In one embodiment, each respective delay period corresponding each respective delay branch is substantially proportional to the quantity of the delay unit in each respective delay branch.

The selection circuit 550 is configured to operably select a quantity of the plural delay units connected in serial, so as to adjust the corresponding delay period. In this embodiment, the selection circuit 550 can generate an adjusting control signal (i.e. adjusting control signals EN1~EN4 as shown in FIG. 5) according to a delay control signal Sdly. The adjusting control signals EN1~EN4 are configured to operably enable or disable the corresponding delay branch and the corresponding delay units in the corresponding delay branch. In other words, the selection circuit 550 is configured to operably select a corresponding delay branch with a desired quantity of delay units connected in series, so as to generate a corresponding delay period.

Figure 6:
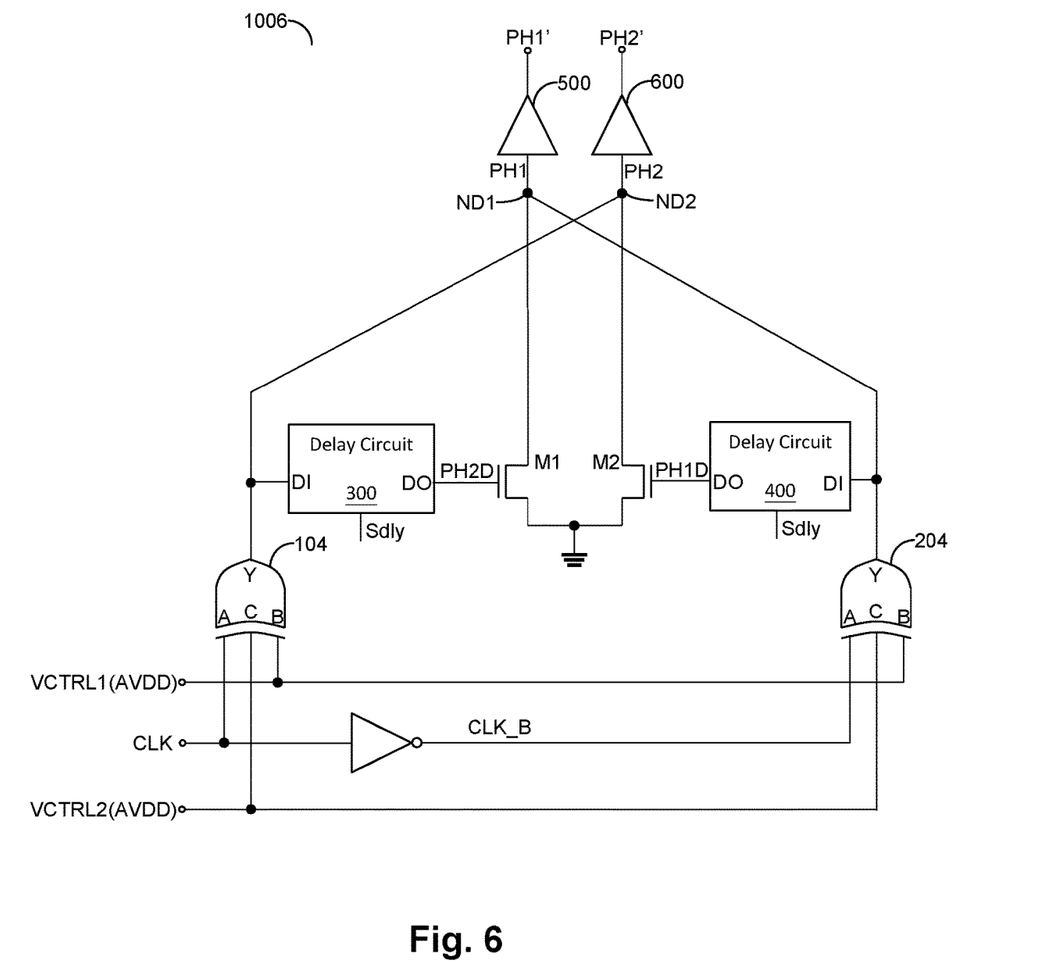
FIG. 6 shows a schematic circuit diagram of a non-overlapping clock generator according to an embodiment of the present invention.

FIG. 6 shows a schematic circuit diagram of a non-overlapping clock generator (i.e., non-overlapping clock generator 1006) according to an embodiment of the present invention. The non-overlapping clock generator 1006 in this embodiment shown in FIG. 6 is similar to the non-overlapping clock generator 1002 in previous embodiment shown in FIG. 2, but is different in that: in the non-overlapping clock generator 1006 in this embodiment, a power supply voltage AVDD of the non-overlapping clock generator 1006 is configured to be the first control voltage VCTRL1 and the second control voltage VCTRL2. In one embodiment, alternatively the power supply voltage AVDD of the non-overlapping clock generator 1006 is configured only as one of the first control voltage VCTRL1 and the second control voltage VCTRL2. It is noteworthy that, in one embodiment, the one of the first control voltage VCTRL1 and the second control voltage VCTRL2, which is not provided by the power supply voltage AVDD of the non-overlapping clock generator 1006, is smaller than or equal to the power supply voltage AVDD.

As described above, the present invention can adjust the non-overlapping period Tnov based upon the aforementioned various approaches. More specifically, the present invention can adjust the non-overlapping period Tnov according to a delay period corresponding to a delay circuit, a first control voltage VCTRL1 or a second control voltage VCTRL2. In one embodiment, the first control voltage VCTRL1 or the second control voltage VCTRL2 can be configured for rough adjustment on the non-overlapping period Tnov, and a delay period corresponding to a delay circuit can be configured for fine adjustment on the non-overlapping period Tnov.

In one embodiment, the first control voltage VCTRL1 and the second control voltage VCTRL2 can be configured according to the following level scopes and combinations thereof, so as to achieve efficacy of optimal adjustment on the non-overlapping period Tnov.

In one embodiment, preferably, the first control voltage VCTRL1 can have a level scope ranging from zero to a difference between the power supply voltage AVDD and the conduction threshold voltage Vth (i.e, AVDD-Vth), wherein Vth denotes the aforementioned conduction threshold voltage of a related MOSFET of the aforementioned XOR gate 103 or 104, and the second control voltage VCTRL2 can have a level scope ranging from conduction threshold voltage Vth to the power supply voltage AVDD or the second control voltage VCTRL2 can be provided by the power supply voltage AVDD. In another embodiment, preferably, the first control voltage VCTRL1 can have a level scope ranging from the aforementioned first preset value to the difference between the power supply voltage AVDD and the conduction threshold voltage Vth (i.e, AVDD-Vth), and the second control voltage VCTRL2 can have a level scope ranging from the conduction threshold voltage Vth to the power supply voltage AVDD or the second control voltage VCTRL2 can be provided by the power supply voltage AVDD.

Instill another embodiment, preferably, the first control voltage VCTRL1 can be provided by the power supply voltage AVDD, and the second control voltage VCTRL2 can have a level scope ranging from the conduction threshold voltage Vth to the power supply voltage AVDD.

Please refer to FIG. 7 shows a signal waveform diagram depicting the operation of a non-overlapping clock generator of the present invention. As shown in FIG. 7, the non-overlapping clock generator (e.g., non-overlapping clock generator 1002, 1004 or 1006) of the present invention is configured to operably generate in-phase output clock signals PH1 and PH1' and reversed-phase output clock signals PH2 and PH2' according to an input clock signal (corresponding to CLK), wherein a non-overlapping period Tnov lies between the in-phase output clock signals PH1 and reversed-phase output clock signals PH2, and wherein a non-overlapping period Tnov lies between the in-phase output clock signals PH1' and reversed-phase output clock signals PH2'. The non-overlapping period Tnov can be adjusted according to the aforementioned first control voltage VCTRL1, second control voltage VCTRL2, setting of a delay circuit and a combination of the aforementioned adjustment approaches.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A non-overlapping clock generator, which is configured to operably generate an in-phase output clock signal and a reversed-phase output clock signal, non-overlapped with each other, according to an input clock signal; the non-overlapping clock generator comprising:
   a first XOR gate and a second XOR gate, which are cross coupled to each other, wherein a first input terminal of the first XOR gate is configured to operably receive an in-phase sub-signal of the input clock signal, and a second input terminal of the first XOR gate is configured to operably receive a first control voltage, wherein a first input terminal of the second XOR gate is configured to operably receive a reversed-phase sub-signal of the input clock signal, and a second input terminal of the second XOR gate is configured to operably receive the first control voltage, wherein the first XOR gate is configured to operably generate the reversed-phase output clock signal at a reversed-phase output terminal of the non-overlapping clock generator, and the second XOR gate is configured to operably generate the in-phase output clock signal at an in-phase output terminal of the non-overlapping clock generator;
   a first load transistor having a first terminal coupled to the in-phase output terminal of the non-overlapping clock generator, wherein a control terminal of the first load transistor is controlled by the reversed-phase output clock signal; and
   a second load transistor having a first terminal coupled to the reversed-phase output terminal of the non-overlapping clock generator, wherein a control terminal of the second load transistor is controlled by the in-phase output clock signal;
   wherein each one of the first XOR gate and the second XOR gate includes: at least one pass transistor logic circuit, which is configured to operably execute XOR logic operation according to corresponding input signals on the first input terminal and the second input terminal, wherein the at least one pass transistor logic circuit is coupled to the first control voltage;
   wherein a non-overlapping period which lies between the in-phase output clock signal and the reversed-phase output clock signal is determined according to the first control voltage.

2. The non-overlapping clock generator of claim 1, wherein each XOR gate of the first XOR gate and the second XOR gate includes:
   a first transistor having a control terminal coupled to the first input terminal, wherein a first terminal of the first transistor is coupled to an output terminal of the XOR gate;
   a second transistor having a control terminal coupled to the first input terminal, wherein a first terminal of the second transistor is coupled to the output terminal, and a second terminal of the second transistor is coupled to the second input terminal; and
   a third transistor having a control terminal coupled to the second input terminal, wherein a first terminal of the third transistor is coupled to the output terminal, and a second terminal of the third transistor is coupled to the first input terminal.

3. The non-overlapping clock generator of claim 2, wherein the first control voltage is greater than a first preset value, so as to prevent the first transistor and the second transistor of the each XOR gate of the first XOR gate and the second XOR gate from being nonconductive simultaneously, wherein the first preset value is correlated with a conduction threshold voltage of at least one of the transistors in the XOR gate.

4. The non-overlapping clock generator of claim 3, wherein the first control voltage is smaller than a difference between a power supply voltage of the non-overlapping clock generator and a conduction threshold voltage of the at least one of the transistors in the each one of the first XOR gate and the second XOR gate.

5. The non-overlapping clock generator of claim 2, wherein the first control voltage is configured as a power supply voltage of the non-overlapping clock generator.

6. The non-overlapping clock generator of claim 2, wherein the each XOR gate of the first XOR gate and the second XOR gate further includes:
   a fourth transistor, which is connected in series to the first transistor, wherein the fourth transistor has a control terminal coupled to a third input terminal of the XOR gate;
   wherein the third input terminal of the first XOR gate and the third input terminal of the second XOR gate are coupled to a second control voltage;
   wherein the non-overlapping period is determined further according to the second control voltage.

7. The non-overlapping clock generator of claim 6, wherein the second control voltage is greater than a conduction threshold voltage of at least one of the transistors in the XOR gate, and wherein the second control voltage is smaller than or equal to a power supply voltage of the non-overlapping clock generator.

8. The non-overlapping clock generator of claim 1, further comprising:
   a first delay circuit, which is coupled between the reversed-phase output terminal of the non-overlapping clock generator and the control terminal of the first load transistor, wherein the first delay circuit is configured to operably delay the reversed-phase output clock signal for a first delay period, so as to generate a reversed-phase delay signal for controlling the first load transistor; and
   a second delay circuit, which is coupled between the in-phase output terminal of the non-overlapping clock generator and the control terminal of the second load transistor, wherein the second delay circuit is configured to operably delay the in-phase output clock signal fora second delay period, so as to generate an in-phase delay signal for controlling the second load transistor;
   wherein the non-overlapping period is determined further according to the first delay period and the second delay period.

9. The non-overlapping clock generator of claim 8, wherein each one of the first delay circuit and the second delay circuit includes:
   plural delay units, which are connected in series, wherein the plural delay units are configured to operably generate a corresponding delay period; and a selection circuit, which is configured to operably select a quantity of the plural delay units connected in serial, so as to adjust the corresponding delay period.

* * * * *